US006885601B2

(12) United States Patent
Nagata

(10) Patent No.: US 6,885,601 B2
(45) Date of Patent: Apr. 26, 2005

(54) MEMORY CIRCUIT AND METHOD OF READING DATA

(75) Inventor: Satoshi Nagata, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/747,241

(22) Filed: Dec. 30, 2003

(65) Prior Publication Data
US 2004/0208078 A1 Oct. 21, 2004

(30) Foreign Application Priority Data
Apr. 15, 2003 (JP) ........................................ 2003-110758

(51) Int. Cl.[7] ................................................. G11C 7/00
(52) U.S. Cl. ............. 365/210; 365/189.05; 365/189.09
(58) Field of Search ........................... 365/210, 189.05, 365/189.09, 203

(56) References Cited

U.S. PATENT DOCUMENTS 5,953,277 A * 9/1999 Mukunoki et al. .......... 365/210
6,018,794 A * 1/2000 Kilpatrick .................... 711/167
6,381,187 B1 * 4/2002 Lee et al. .................... 365/207

FOREIGN PATENT DOCUMENTS

JP  6-259955   9/1994
JP  9-139066   5/1997

* cited by examiner

Primary Examiner—Vu A. Le
(74) Attorney, Agent, or Firm—Rabin & Berdo, P.C.

(57) ABSTRACT

Malfunction caused by a parasitic capacitance generated between bit lines is prevented. Dummy bit lines are arranged opposite to an address decoder while sandwiching a date storage section. The dummy bit lines are arranged such that the both right and left dummy bit lines having cell transistors sandwich the central dummy bit line having no cell transistor.

9 Claims, 3 Drawing Sheets

MEMORY CIRCUIT AND METHOD OF READING DATA

BACKGROUND OF THE INVENTION

1. Field of the Invention

The invention relates to a memory, a circuit for reading information stored in the memory, and a method of reading information stored in the memory.

2. Description of Related Art

A conventional memory circuit is now described. The conventional memory circuit comprises a data storage section made up of a plurality of word lines and a plurality of bit lines which are arranged in a grid shape, a pre-charge circuit for supplying an electric charge to each bit line, an address decoder for supplying the electric charge to a selected specific word line, a level detection circuit for detecting a voltage of each bit line, and a latch circuit for temporarily holding (latching) information as the voltage detected by the level detection circuit.

Although the word lines and the bit lines in the data storage section are arranged in a grid shape, these lines are not electrically directly connected to each other at the intersections of these lines in the grid shape arrangement. However, there is a case that transistors corresponding to the intersections are arranged at each intersection. Data is written in the data storage section depending on the presence or absence of the transistor. If there exist transistors arranged corresponding to the intersections, each transistor is electrically connected to a word line of the corresponding intersection at its gate, to a bit line thereof at its source, and to a ground at its drain.

Dummy bit lines are provided opposite to the address decoder via the data storage section. The dummy bit lines are arranged at the position more faraway from the address decoder than any other bit lines. The configuration and the connection relation of the dummy bit lines are substantially the same as those of other bit lines. However, for the dummy bit lines, there exist corresponding transistors at all the intersections between the dummy bit lines and the word lines.

The operations of the conventional memory and the memory read circuit are described next.

The pre-charge circuit supplies an electric charge to each bit line in response to a clock signal which is supplied from an external device. It is natural that a voltage of each bit line rises upon receipt of the electric charge from the pre-charge circuit.

The address decoder designates one specific word line upon receipt of a signal from an external device, and supplies the electric charge to the selected word line. Then, a voltage of that word line rises so that the transistor connected to the word line turns ON.

If a transistor corresponding to the intersection between some bit line and the designated word line exists at the intersection, the electric charge which is supplied to that bit line leaks to the ground through the transistor. Accordingly, the voltage of that bit line drops. On the contrary, if a transistor corresponding to the intersection between some bit line and the designated word line does not exist at the intersection, the voltage of that bit line is held high.

The level detection circuit detects the magnitude of the voltage of each bit line soon after the address decoder supplies the electric charge to the word lines, and outputs the magnitude of the voltage to the latch circuit as data. The latch circuit latches the data received from the level detection circuit and reads the latched data.

When reading data, a timing for detecting the magnitude of the voltage of the bit line presents a problem. The dummy bit lines are used for designating the timing for reading data.

When the address decoder designates a specific word line and supplies the electric charge to the designated word line, the voltage of the word line rises first in the order of those close to the address decoder due to a capacitance and a resistance of the word line per se. Meanwhile, as mentioned earlier, the dummy bit lines are arranged at the position more faraway from the address decoder than any other bit lines. Accordingly, after the gates of all the transistors corresponding to the intersections between the designated word line and the other bit lines turn ON, the gates of the transistors corresponding to the intersections between the designated word line and the dummy bit lines turn ON last. The detection of the magnitude of the voltage of the bit line utilizes this character.

That is, for the above reason, the dummy bit lines are slow in drop of the voltage compared with other bit lines. Accordingly, when the voltage of the dummy bit lines is lower than a certain level, the level detection circuit detects the voltage of the other bit lines. The reason is that the bit line, which is to drop in voltage of the other bit lines, sufficiently drop in voltage.

By use of the method of detecting the magnitude of the voltage of the bit lines, the magnitude of the voltage of the bit lines can be quickly detected, thereby reading data at high speed.

However, the conventional memory circuit has the following problems. That is, a parasitic capacitance is generated between the adjoining bit lines of the bit lines in the data storage section. Accordingly, even if a transistor corresponding to the intersections between the bit lines and the designated word line does not exist at each intersection, the voltage of the bit lines temporarily drops due to the generation of the parasitic capacitance. There occurs a case where the amount of drop of the voltage exceeds the threshold voltage of the level detection circuit depending on the magnitude of the parasitic capacitance. If such a case occurs, the voltage of the bit line, which has to be decided high, is decided to be low. As a result, there occurs malfunction such that the output from the latch circuit is rendered wrong.

SUMMARY OF THE INVENTION

To resolve the problems set forth above, a memory circuit of the invention is characterized in comprising a data storage section connected to an address decoder by a plurality of word lines, a voltage stable detection section connected to the address decoder by the plurality of word lines and also connected to the address decoder via said data storage section, wherein the voltage stable detection section is made up of a first dummy bit line having no cell transistor corresponding to intersections between itself and the plurality of word lines at each intersection and second dummy bit lines having cell transistors corresponding to intersections between themselves and the plurality of word lines at each intersection.

DETAILED DESCRIPTION OF THE INVENTION

First Embodiment

Figure 1:
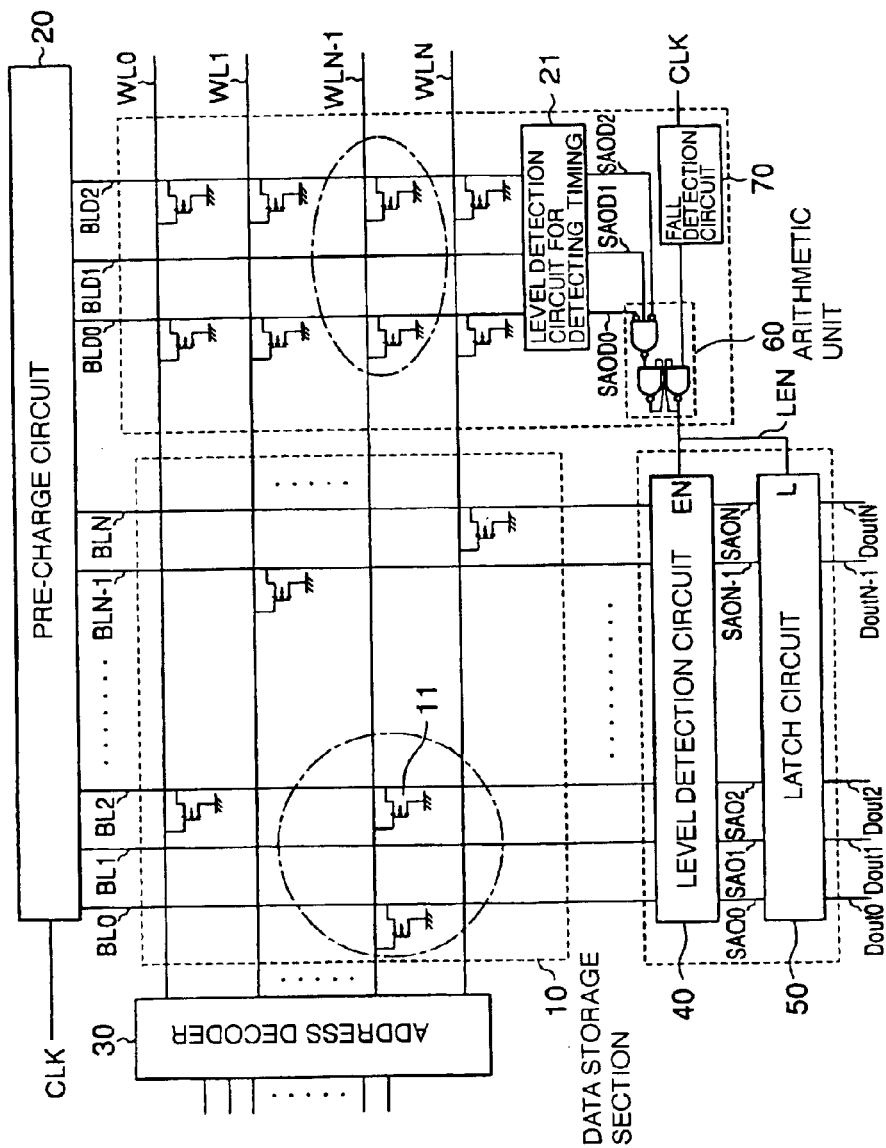
FIG. 1 is a circuit diagram of a memory circuit according to the first embodiment of the invention.
Figure 2:
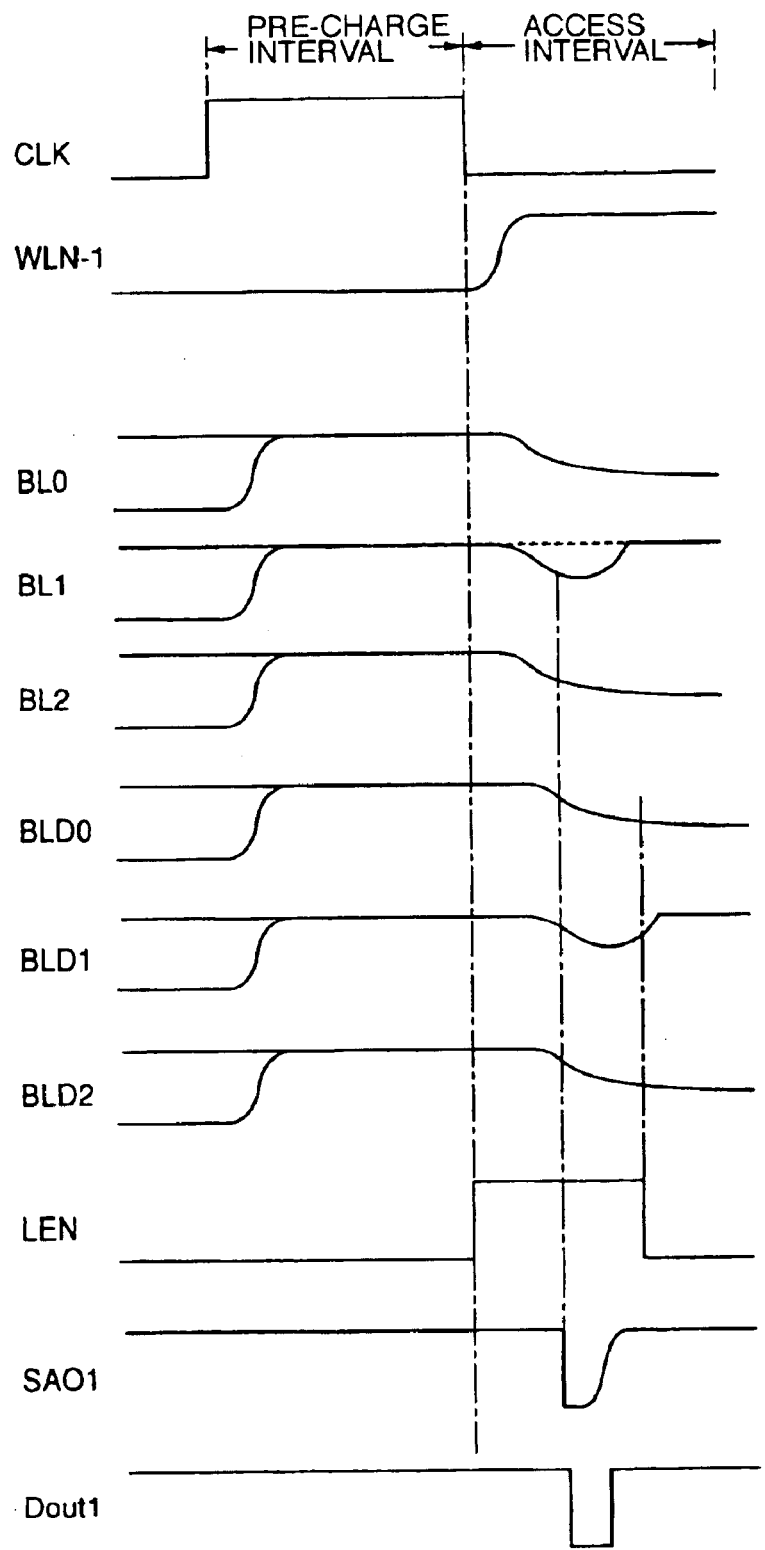
FIG. 2 is a timing chart showing the operation of the memory circuit of the first embodiment.

FIG. 1 is a circuit diagram of a memory circuit according to the first embodiment of the invention. FIG. 2 is a timing chart showing the operation of the memory circuit of the first embodiment. The designation represented in the timing chart in FIG. 2 correspond to the designation of each conducting wire such as word lines, bit lines or the like.

The first embodiment of the invention is now described with reference to FIGS. 1 and 2. The circuit configuration of the first embodiment of the invention is first described with reference to FIG. 1.

The memory circuit of the first embodiment of the invention comprises a data storage section 10 made up of a plurality of word lines WL0 to WLN and a plurality of bit lines BL0 to BLN, a pre-charge circuit 20 for supplying and electric charge to the bit lines BL0 to BLN, an address decoder 30 for supplying the electric charge to a selected specific word line of the word lines WL0 to WLN, a level detection circuit 40 for reading each voltage of the bit lines BL0 to BLN, and a latch circuit 50 for temporarily holding (latching) information as the voltage read by the level detection circuit 40. The level detection circuit 40 and the latch circuit 50 are connected to each other by output bit lines SAO0 to SAON corresponding to the bit lines BL0 to BLN. A clock signal input line CLK is connected to the pre-charge circuit 20 and external output lines Dout0 to DoutN corresponding to the output bit lines SAO0 to SAON are connected to the latch circuit 50.

Cell transistors (referred to transistors 11) corresponding to each intersection are arranged at a part of a plurality of intersections between the plurality of word lines WL0 to WLN and the plurality of bit lines BL0 to BLN which are arranged in grid shape. Respective word lines WL0 to WLN and respective bit lines BL0 to BLN in the data storage section 10 are not directly electrically connected to each other at the intersections arranged in grid shape. However, if there exist transistors 11 which are arranged corresponding to the intersections, the transistors 11 are electrically connected to the corresponding word lines of the word lines WL0 at gates thereof, to the corresponding bit lines of the bit lines BL0 to BLN at sources thereof, and to the ground at drains thereof.

Three dummy bit lines BLD0 to BLD2 serving as a voltage stable detection section are provided at the potion opposite to the address decoder 30 while sandwiching the data storage section 10 therebetween. The dummy bit lines BLD0 to BLD2 are arranged in the order of BLD0, BLD1, BLD2 close to the data storage section 10. The configuration and the connection relation of the dummy bit lines BLD0 to BLD2 are substantially the same as those of the other bit lines BL0 to BLN. However, there exist transistors 11 corresponding to all the intersection between the dummy bit lines BLD0 and BLD2 and the word lines WL0 to WLN. For dummy bit line BLD1, which is sandwiched between the dummy bit lines DLD0 and BLD2, no transistor is connected at the intersections between the dummy bit line BLD1 and each line of the word lines WL0 to WLN. The dummy bit lines BLD0 to BLD2 are not connected to the level detection circuit 40 which are connected to other bit lines BL0 to BLN. The dummy bit lines BLD0 to BLD2 are connected to a level detection circuit 21 for detecting timing.

The level detection circuit 21 for detecting timing is connected to an arithmetic unit 60 via the outputting dummy bit lines SAOD0 to SAOD2 corresponding to the dummy bit lines BLD0 to BLD2.

The arithmetic unit 60 comprises a NAND circuit and a flip-flop circuit. The outputting dummy bit lines SAOD0 to SAOD2 are connected to the NAND circuit, wherein the outputting dummy bit lines SAOD0 and SAOD2 are connected to an inverting input terminal of the NAND circuit, and the outputting dummy bit line SAOD1 is connected to a non-inverting terminal of the NAND circuit. An output of the NAND circuit is connected to the flip-flop circuit, and an output of the flip-flop is connected to the level detection circuit 40 and the latch circuit 50 by a control line LEN. The clock signal input line CLK is connected to the flip-flop circuit in the arithmetic unit 60 via a fall detection circuit 70.

The operation of the first embodiment of the invention is now described with reference to FIG. 2.

When the voltage of the clock signal input line CLK rises in response to a clock signal which is supplied from an external device, the pre-charge circuit 20 supplies an electric charge to each bit line of the bit lines BL0 to BLN including the bit lines dummy BLD0 to BLD2. Then, the voltages of the bit lines BL0 to BLN and the dummy bit lines BLD0 to BLD2 rise upon receipt of the electric charge.

When the voltage of the clock signal supply line CLK falls, the address decoder 30 designates one of a specific word line of the word lines WL0 to WLN and supplies the electric charge to the designated word line. Assume that the electric charge is supplied to the word line WLN-1 in the description of the invention. Since the voltage of the word line WLN-1 rises, gates of all the transistors 11 connected to the word line WLN-1 turn ON. Meanwhile, at the same time, the fall detection circuit 70 connected to the arithmetic unit 60 detects the fall of the voltage of the clock signal supply line CLK. Then the voltage of the control line LEN rises, and hence the level detection circuit 40 operates and the latch circuit 50 is rendered in a through state.

In this case, if there exist transistors 11 corresponding to the intersections between the bit lines and the designated word line, the electric charge supplied to the bit lines leaks to the ground through the transistors 11. Referring to FIG. 1, since the transistors 11 are connected at the intersections between the bit lines BL0 and BL2 and the word line WLN-1, the voltages of the bit lines BL0 and BL2 gradually drop. On the contrary, if there does not exist the transistor 11 at the intersection between some bit line and the designated word line, the voltage of some bit line is held high. Referring to FIG. 1, some bit line corresponds to the bit line BL1. Accordingly, the change of the voltage of the bit line BL1 is represented by the dotted line in BL1 shown in FIG. 2.

However, if the voltages of the bit lines adjacent to some bit line drops, there occurs a drop of the voltage due to the parasitic capacitance generated between some bit line and the adjacent bit lines. Referring to FIG. 1, some bit line corresponds to the bit line BL1 wherein the voltage of the bit line BL1 actually once drops, and the change of the voltage of the BL1 is represented by the solid line in BL1 shown in FIG. 2. Accordingly, the voltage of the output bit line SAO1 corresponding to the bit line BL1 once drops. Then, the voltage of the external output line Dout1 corresponding to the output bit line SAO1 once drops as the voltage of the output bit line SAO1 drops.

However, three dummy bit lines BLD0 to BLD2 have the same configuration as those of the bit lines BL0 to BL2. Accordingly, the voltage of central dummy bit line BLD1 once drops owing to the same reason set forth above. Further, three dummy bit lines BLD0 to BLD2 the dummy bit lines are arranged at the position most faraway from the address decoder 30. When the address decoder 30 designates the specific word line from the word lines WL0 to WLN and supplies the electric charge to the designated word line, the voltages of the word lines rise first in the order of those close to the address decoder 30 due to the capacitance and resistance of the word lines per se. Accordingly, the drop and second rise of the central dummy bit line BLD1 occur for the last time compared with those of the other bit lines BL0 to BLN.

With the operations occurring sequentially, when the voltages of the dummy bit lines BLD0 and BLD2 are lower than the threshold voltage of the level detection circuit 21 for detecting timing and the voltage of the dummy bit line BLD1 rises up to not less than the threshold voltage of the level detection circuit 21 for detecting timing, the output dummy bit lines SAD0, SAD1 AND SAD2 connected to the level detection circuit 21 for detecting timing output the low voltage, high voltage and low voltage to the AND circuit in the arithmetic unit 60. Then, the voltage of the control line LEN drops. Accordingly, the operation of the level detection circuit 40 stops and the latch circuit 50 is rendered in a latch state.

At this time, the level detection circuit 40 has already detected the magnitude of the voltages of the bit lines BL0 to BLN including the bit lines BL0 to BL2, and has outputted the magnitude of the voltages as data to the latch circuit 50. Further, the latch circuit 50 is in a state of latching the data inputted from the level detection circuit 40. Upon stoppage of the operation of the level detection circuit 40 and latch circuit 50, data latched by the latch circuit 50 is read through the external output lines Dout0 to DoutN.

As mentioned above, according to the first embodiment, the dummy bit lines which are arranged at the position most faraway from the address decoder are arranged side-by-side by three. A transistor corresponding to the intersections between the central dummy bit line and the respective word line is not arranged on the central bit line. On the other hand, the transistors corresponding to the intersections between the right and left dummy bit lines and the respective word lines are arranged on the right and left dummy bit lines. With such a construction, the voltage of the central dummy bit line once drops. Further, three dummy bit lines are arranged at the position most faraway from the address decoder, the drop and second rise of the voltage of the central dummy bit line occur for the last time compared with other bit lines. When the level detection circuit for detecting timing reads the second rise of the voltage of the central dummy bit line to determine the timing for outputting data from the latch circuit. Accordingly, it is possible to accurately measure the timing for outputting data, so that the apparatus does not malfunction.

Second Embodiment

Figure 3:
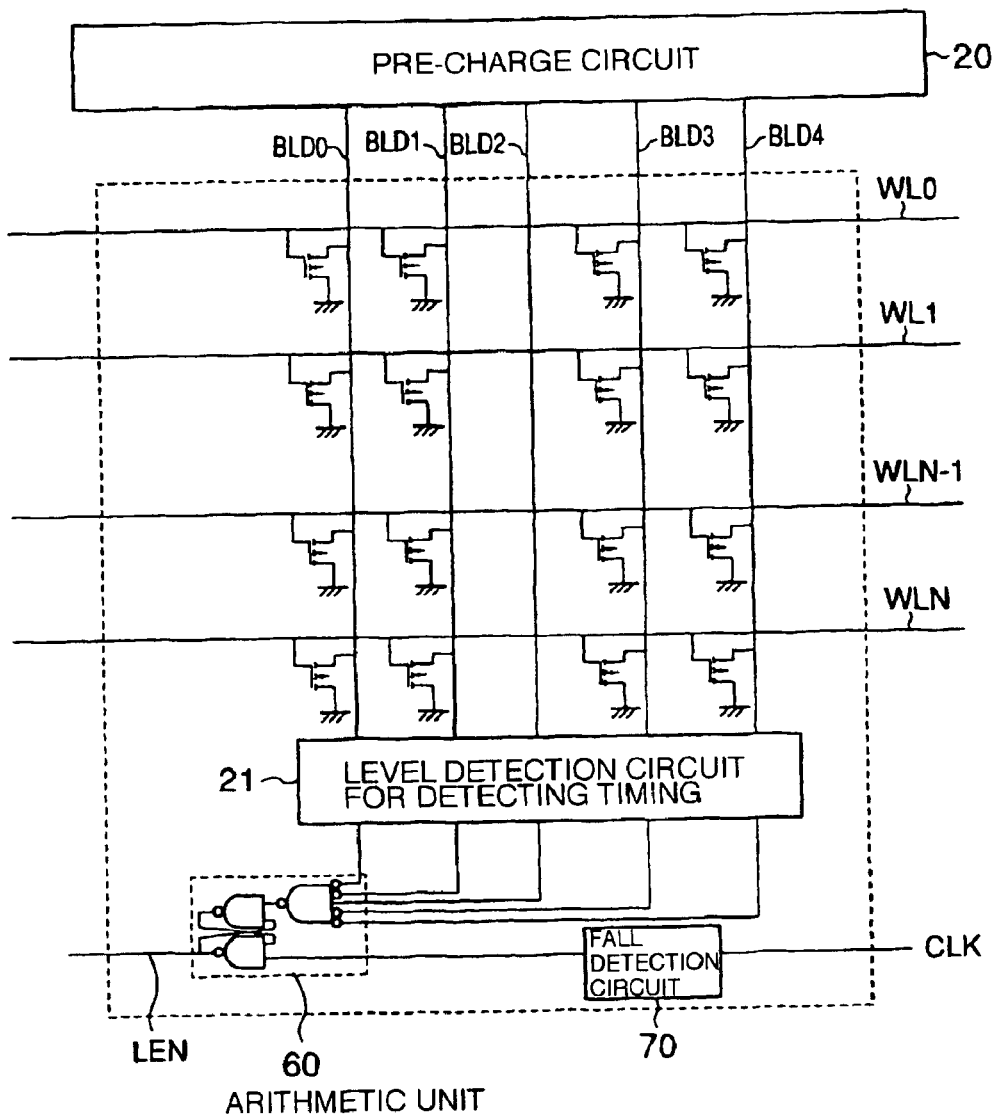
FIG. 3 is a circuit diagram showing a characterized part of a memory circuit according to the second embodiment of the invention.

FIG. 3 is a circuit diagram showing the characterized part according to the second embodiment of the invention. The second embodiment of the invention is now described with reference to FIG. 3. The second embodiment of the invention is similar to the first embodiment, and hence detailed description thereof is omitted.

The feature of the second embodiment of the invention resides in the provision of 5 dummy bit lines as the voltage stable detection section. The dummy bit lines BLD0 to BLD4 are arranged at substantially the same position as the first embodiment, and arranged in the order of the dummy bit lines BLD0, BLD1, BLD2, BLD3, BLD4 close to the address decoder 30. The configuration and connection relation of the dummy bit lines BLD0 to BLD4 are substantially the same as those of the other bit lines BLD to BLN. For the dummy bit line BLD 2 arranged at the center, no transistor is connected at all intersections between itself and each of the word lines WL0 to WLN. For the other dummy bit lines BLD1, BLS, BLD3, BLD4, transistors 11 corresponding to the intersections between themselves and the word lines WL0 to WLN exist at the same intersections. Further, the dummy bit lines BLD0 to BLD4 are connected to the level detection circuit 21 for detecting timing. The dummy bit line BLD2 is connected to the non-inverting input terminal of the NAND circuit inside the level detection circuit 21 for detecting timing and other dummy bit lines are connected to the inverting input terminals of the NAND circuit.

The arrangement and connection relation between a precharge circuit 20, an arithmetic unit arithmetic unit 60, a fall detection circuit 70, a control line LEN, a clock signal input line CLK, and portions not shown in FIG. 3 are the same as those of the first embodiment.

A parasitic capacitance which is generated in some bit line is not always generated between the adjacent bit lines, but generated strictly between all the adjacent bit lines. As the parasitic capacitance generated between the neighboring bit lines is large, the recovery of the voltage of the bit lines is more delayed. Since only the parasitic capacitance generated between the adjacent bit lines is considered in the circuit configuration of the first embodiment, there is a likelihood of decision of the magnitude of the voltage of the bit lines in a state where the recovery of the voltage is not sufficient. Accordingly, not only the parasitic capacitance, which is generated between the adjacent bit lines, but also the parasitic capacitance, which is generated between the other neighboring bit lines, has to be considered so as to ensure more accurate operation.

According to the second embodiment of the invention, the circuit configuration also considers the parasitic capacitance between the adjacent two ahead bit lines, and hence more accurate operation having no malfunction is ensured compared with the first embodiment.

As mentioned above, the dummy bit lines which are arranged at the position most faraway from the address decoder than any other bit lines are arranged side-by-side by plural number. A transistor corresponding to the intersections between the central dummy bit line and the respective word lines is not arranged at the central dummy bit line. Meanwhile, transistors corresponding to the intersections between the dummy bit lines other than the central dummy bit line and the respective word lines are arranged at the bit lines other than the central dummy bit lines With such a configuration of the memory circuit, the voltage of the central dummy bit line once drops. Further, the dummy bit lines are arranged at the position most faraway from the address decoder, the drop and second rise of the voltage of the central bit line occur for the last time compared with those of the other bit lines. When the level detection circuit for detecting timing reads the second rise of the voltage of the central dummy bit line to determine the timing for outputting data from the latch circuit. Accordingly, it is possible to accurately measure the timing for outputting data, so that the apparatus does not malfunction.

What is claimed is:

1. A memory circuit comprising:
   an address decoder;
   a data storage section connected to said address decoder by a plurality of word lines;

a voltage stable detection section connected to said address decoder by the plurality of word lines and also connected to said address decoder via said data storage section;

said voltage stable detection section made up of a first dummy bit line having no cell transistor corresponding to intersections between itself and the plurality of word lines at each intersection and second dummy bit lines having cell transistors corresponding to intersections between themselves and the plurality of word lines at each intersection.

2. The memory circuit according to claim 1, wherein a gate, a source, and a drain of each cell transistor are connected to a corresponding word line, a corresponding bit line, and the ground, respectively.

3. The memory circuit according to claim 1, further comprising:

a pre-charge circuit connected to said data storage section and said voltage stable detection section;

a level detection circuit connected to said data storage section; and a latch circuit connected to said level detection circuit.

4. The memory circuit according to claim 1, wherein said second dummy bit lines are provided at both sides of said first dummy bit line.

5. The memory circuit according to claim 1, wherein a plurality of second dummy bit lines are provided at both sides of said first dummy bit line.

6. The memory circuit according to claim 1, wherein said voltage stable detection section is arranged opposite to said address decoder while sandwiching said data storage section.

7. A method of reading data comprising the steps of:

supplying an electric charge to a plurality of bit lines of a data storage section comprising the plurality of bit lines and a plurality of word lines;

supplying the electric charge to first and second dummy bit lines of a voltage stable detection section made up of the first dummy bit line having no cell transistor corresponding to intersections between itself and the plurality of word lines, and the second dummy bit lines having cell transistors corresponding to intersections between themselves and the plurality of word lines, said first and second dummy bit lines being arranged side-by-side;

supplying the electric charge to the plurality of word lines of said data storage section, and subsequently supplying the electric charge to the plurality of word lines of said voltage stable detection section; and reading data from said data storage section when the voltage of the first and second dummy bit lines are stabilized after supplying the electric charge to the plurality of word lines of said voltage stable detection section.

8. The method of reading data according to claim 7, further comprising the step of selecting a structure of said voltage stable detection section made up of said first dummy bit line and said second dummy bit lines arranged at both sides of said first dummy bit line.

9. The method of reading data according to claim 7, further comprising the step of selecting a structure of said voltage stable detection section made up of said first dummy bit line and a plurality of said second dummy bit lines arranged at both sides of said first dummy bit line.

* * * * *